(12) United States Patent
Tarui et al.

(10) Patent No.: US 7,285,465 B2
(45) Date of Patent: Oct. 23, 2007

(54) METHOD OF MANUFACTURING A SIC VERTICAL MOSFET

(75) Inventors: Yoichiro Tarui, Tokyo (JP); Ken-ichi Ohtsuka, Tokyo (JP); Masayuki Imaizumi, Tokyo (JP); Hiroshi Sugimoto, Tokyo (JP); Tetsuya Takami, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 57 days.

(21) Appl. No.: 11/353,992

(22) Filed: Feb. 15, 2006

(65) Prior Publication Data

US 2006/0134847 A1 Jun. 22, 2006

Related U.S. Application Data

(62) Division of application No. 10/802,824, filed on Mar. 18, 2004, now Pat. No. 7,029,969.

(30) Foreign Application Priority Data

Mar. 28, 2003 (JP) ............................. 2003-090956
Jan. 26, 2004 (JP) ............................. 2004-017002

(51) Int. Cl.
*H01L 21/336* (2006.01)
(52) U.S. Cl. ...................... 438/268; 438/285; 438/525; 257/E21.059; 257/E21.065
(58) Field of Classification Search ................ 438/268, 438/285, 525; 257/E21.059, E21.065
See application file for complete search history.

(56) References Cited

U.S. PATENT DOCUMENTS 5,322,802 A * 6/1994 Baliga et al. ................ 438/268
5,384,270 A 1/1995 Ueno
5,397,717 A 3/1995 Davis et al.
5,451,797 A 9/1995 Davis et al.
5,814,859 A 9/1998 Ghezzo et al.
6,054,352 A 4/2000 Ueno
6,096,607 A 8/2000 Ueno
6,117,735 A * 9/2000 Ueno ......................... 438/268
6,465,807 B1 10/2002 Ueno
6,573,534 B1 6/2003 Kumar et al.
6,765,264 B1 * 7/2004 Chang et al. ................ 257/336
7,034,346 B2 * 4/2006 Nakayama et al. ......... 257/249

FOREIGN PATENT DOCUMENTS

| JP | 06-151860 | 5/1994 |
| JP | 11-111728 | 4/1999 |
| JP | 11-274173 | 10/1999 |

\* cited by examiner

*Primary Examiner*—Trung Dang
(74) *Attorney, Agent, or Firm*—Leydig, Voit & Mayer, Ltd.

(57) ABSTRACT

A semiconductor device and its manufacturing method are provided in which the trade-off relation between channel resistance and JFET resistance, an obstacle to device miniaturization, is improved and the same mask is used to form a source region and a base region by ion implantation. In a vertical MOSFET that uses SiC, a source region and a base region are formed by ion implantation using the same tapered mask to give the base region a tapered shape. The taper angle of the tapered mask is set to 30° to 60° when the material of the tapered mask has the same range as SiC in ion implantation, and to 20° to 45° when the material of the tapered mask is $SiO_2$.

4 Claims, 12 Drawing Sheets

METHOD OF MANUFACTURING A SIC VERTICAL MOSFET

This application is a divisional of U.S. patent application Ser. No. 10/802,824, filed Mar. 18, 2004, now U.S. Pat. No. 7,029,969.

BACKGROUND OF THE INVENTION

1. Field of the Invention

The present invention relates to a semiconductor device structure in which a vertical MOSFET using SiC is fabricated by ion implantation, and to a method of manufacturing the structure.

2. Description of the Related Art

Conventionally, to manufacture a vertical MOSFET that uses SiC by ion implantation, a mask for ion implantation of a source region has to be different in width from a mask for ion implantation of a base region (see JP 10-233503 A, for example).

Because of the use of different masks in ion implantation of a source region and a base region, the conventional semiconductor device manufacturing method described above increases the number of steps to manufacture the MOSFET. In addition, the process precision of each mask and the accuracy of aligning the two masks influence the channel length, which is one of the factors that determine characteristics of the MOSFET thus posing a great obstacle to device miniaturization. Furthermore, if device miniaturization is advanced, it brings another problem of increased JFET resistance, which is in a trade-off relation with channel resistance lowered by the miniaturization.

SUMMARY OF THE INVENTION

The present invention has been made in view of the above, and an object of the present invention is therefore to provide a semiconductor device, which is improved in the trade-off relation between channel resistance and JFET resistance, which presents a problem in device miniaturization.

Another object of the present invention is to provide a method of manufacturing a semiconductor device which makes it possible to use the same mask to form by ion implantation a source region and base region of a vertical MOSFET that is formed from SiC, and to advance device miniaturization.

A semiconductor device of the present invention relates to a vertical MOSFET that uses SiC, and has a tapered base region.

According to a method of manufacturing a semiconductor device of the present invention, when a vertical MOSFET using SiC is manufactured, a source region and a base region are formed by ion implantation using the same mask.

According to a semiconductor device of the present invention, a base region of a vertical MOSFET that uses SiC is tapered, thereby being capable of improving the trade-off relation between channel resistance and JFET resistance, and of advancing device miniaturization.

According to a method of manufacturing a semiconductor device of the invention, when a vertical MOSFET using SiC is manufactured, the same mask is used to form a source region and a base region by ion implantation and an impurity is selectively doped in a self-aligning manner to complete the MOSFET. The manufacturing method thus makes it possible to advance device miniaturization.

DETAILED DESCRIPTION OF THE PREFERRED EMBODIMENTS

An outline of the present invention is given first. In manufacture of a vertical MOSFET that uses SiC, it is difficult to diffuse an impurity through heat treatment, thus excluding from options a self-alignment process through thermal diffusion of an impurity as the one employed in manufacture of a vertical MOSFET that uses Si. Typically, selective impurity doping is performed by ion implantation.

On the other hand, Si vertical MOSFET's high thermal diffusibility makes it difficult to control the shape (taper angle) of a region formed by ion implantation (ion implantation region) whereas SiC vertical MOSFET's thermal diffusibility that is ignorably low makes it easy to control the shape (taper angle) of an ion implantation region in a depth direction and in a lateral direction.

Conventionally, an implantation mask has vertical side faces for vertical ion implantation with respect to a substrate, and masks different from each other in width have to be used to form a source region and a base region by ion implantation since prior art is incapable of impurity doping by self-alignment process that uses the same mask. After the ion implantation, activation annealing at a temperature of about 1500° C. is needed and it could cause some damage like roughening of a SiC surface.

Accordingly, if a gate electrode serves as the only mask that is used throughout ion implantation, the gate electrode and a gate oxide film are damaged upon the activation annealing. It is therefore difficult to use a gate electrode as an implantation mask.

In view of the above, a vertical MOSFET that uses SiC according to the present invention is characterized by using the same ion implantation mask to form a source region and a base region by ion implantation. The mask is tapered or ions are implanted obliquely, thereby making it possible to manufacture the MOSFET through selective impurity doping in a self-aligning manner. The base region formed by this method is given a tapered shape and accordingly is characterized by its JFET resistance smaller than that of a conventional base region, which has an approximately vertical shape. Specific embodiment modes for carrying out the present invention will be described below.

Embodiment 1

Figure 1:
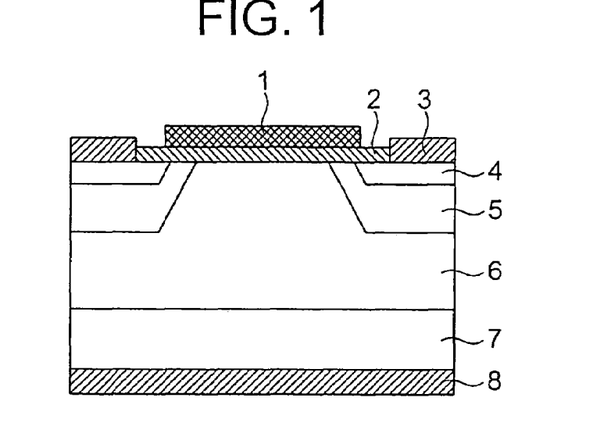
FIG. 1 is a sectional view showing a semiconductor device (SiC vertical MOSFET) manufactured in accordance with Embodiment 1 of the present invention.

FIG. 1 is a sectional view showing a semiconductor device (SiC vertical MOSFET) manufactured in accordance with Embodiment 1 of the present invention. A source region 4 and a base region 5 are formed by ion implantation in a drift region 6, which is formed through epitaxial growth on a substrate 7. Then a gate oxide film 2, a gate electrode 1, a source electrode 3, and a drain electrode 8 are formed to complete the MOSFET.

Figure 2:
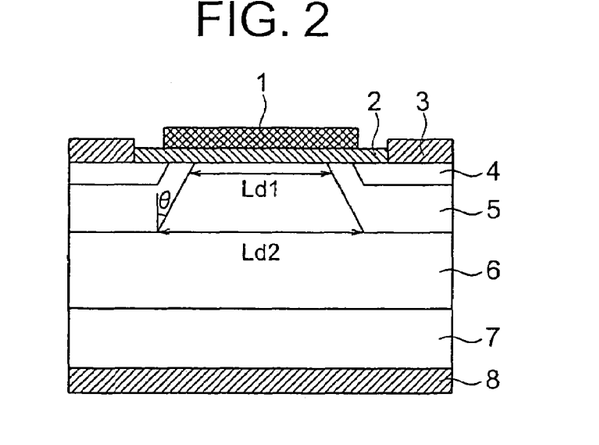
FIG. 2 is a diagram to illustrate the device structure of the semiconductor device that is manufactured in accordance with Embodiment 1 of the present invention.
Figure 3:
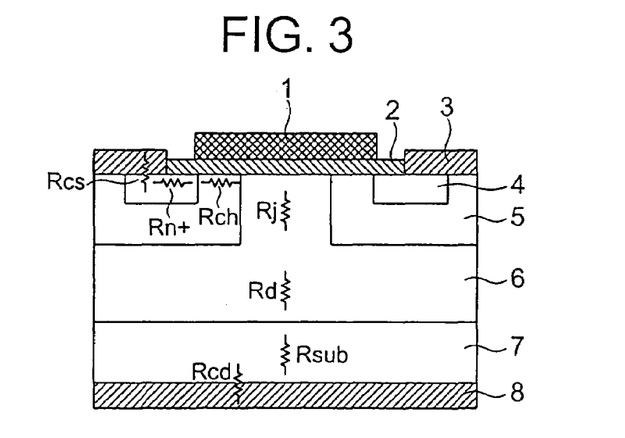
FIG. 3 is a diagram to illustrate ON resistance of the semiconductor device that is manufactured in accordance with Embodiment 1 of the present invention.

An effect of providing the p base region 5 of this semiconductor device with a taper angle θ as shown in FIG. 2 is described. As shown in FIG. 3, ON resistance, which is indicative of the performance of the semiconductor device (vertical MOSFET), is divided into several components: source contact resistance Rcs, n source sheet resistance Rn+, channel resistance Rch, JFET resistance Rj, drift resistance Rd, substrate resistance Rsub, and drain contact resistance Rcd. The channel resistance Rch is currently the largest in a vertical MOSFET that uses SiC, and presents the greatest obstacle to practical application of a SiC vertical MOSFET.

One way to reduce the channel resistance Rch is device miniaturization (in which a MOSFET is reduced in channel length and increased in channel width). In this case, there is a trade-off relation between an interval of the p base region 5 (see FIG. 2, Ld1: an upper interval of the p base region 5, Ld2: a lower interval of the p base region 5) and the JFET resistance Rj, causing Rj to increase while reducing Ld. Providing the p base region 5 with the taper angle θ brings an effect of improving the trade-off relation between the channel resistance Rch and the JFET resistance Rj.

Figure 4:
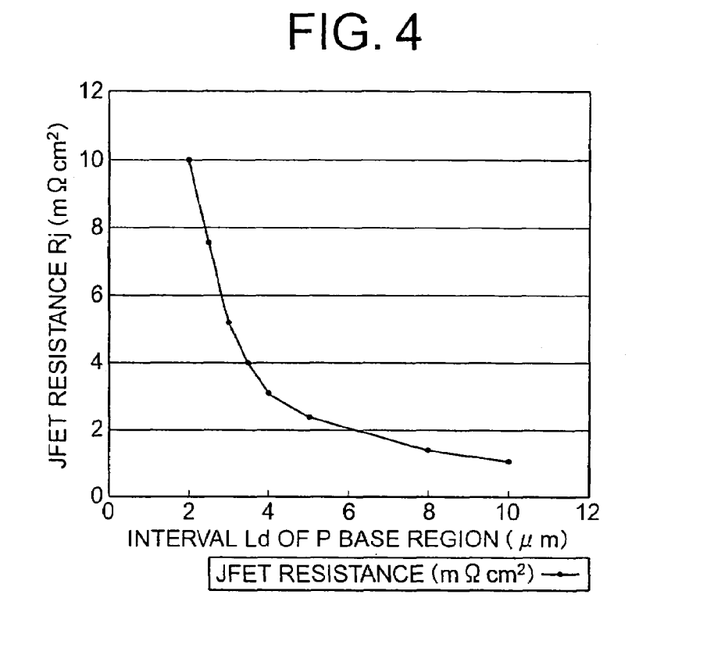
FIG. 4 is a graph showing results of an experiment that has been conducted to examine the relation between interval Ld of a p base region 5 and JFET resistance Rj in the semiconductor device that is manufactured in accordance with Embodiment 1 of the present invention.

In order to obtain a specific estimation of this effect, an experiment has been conducted in which a MOSFET with the taper angle θ set to 0° is first prepared as a test sample to examine the relation between the interval of the p base region 5 and the JFET resistance Rj. Results thereof are shown in FIG. 4. The test sample is manufactured as a device that is capable of withstanding 1200 V to be used for an in-vehicle or industrial inverter, and employs for the drift region 6 a 10 μm-thick substrate having a carrier concentration of $1 \times 10^{16}$ $cm^{-3}$. The results show that the JFET resistance Rj rapidly increases as the interval Ld (Ld=Ld1=Ld2) of the p base region 5 is reduced.

According to the results shown in FIG. 4, the JFET resistance Rj can be reduced by increasing the interval Ld of the p base region 5. However, this lowers the withstand voltage of the MOSFET. As a result of evaluation made by actually preparing a test sample, it has been found that, when the interval Ld of the p base region 5 is 4 μm or larger, an increased electric field is applied to the gate oxide film 2 and the withstand voltage of the MOSFET becomes lower than a theoretical withstand voltage calculated from a p-n junction.

To summarize the above, the JFET resistance Rj rapidly increases when the interval Ld of the p base region 5 becomes 2 μm or smaller, although the interval Ld of the p base region 5 is desired to be small from the viewpoint of miniaturization, and the withstand voltage of the MOSFET is lowered when the interval Ld of the p base region 5 becomes 4 μm or larger. Accordingly, the optimum value of the interval Ld of the p base region 5 is between 2 μm and 4 μm.

The trade-off relation between the JFET resistance Rj and the channel resistance Rch of the p base region 5 when the p base region 5 has the taper angle θ is examined based on the above results. To elaborate, the relation among the taper angle θ, the JFET resistance rj, and the channel resistance Rch is calculated on the assumption that the device is for use as an in-vehicle or industrial inverter and is capable of withstanding 1200 V.

Figure 5:
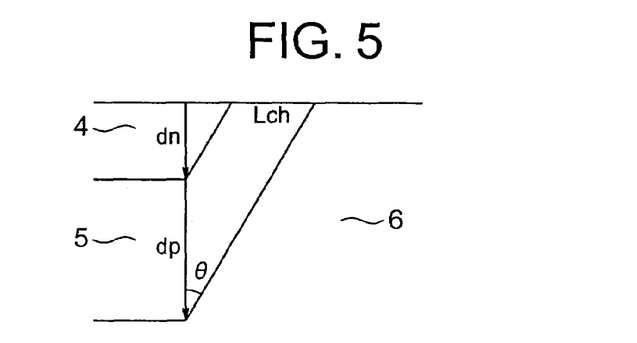
FIG. 5 is a diagram to illustrate the relation among a taper angle θ of the p base region 5, a channel length Lch, and the intervals Ld1 and Ld2 of the p base region in the case where an n source region 4 is tapered in the semiconductor device that is manufactured in accordance with Embodiment 1 of the present invention.
Figure 6:
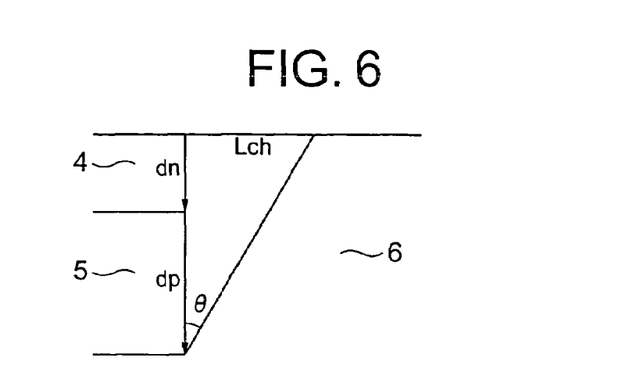
FIG. 6 is a diagram to illustrate the relation among a taper angle θ of the p base region 5, a channel length Lch, and the intervals Ld1 and Ld2 of the p base region in the case where the n source region 4 is not tapered in the semiconductor device that is manufactured in accordance with Embodiment 1 of the present invention.

For simplification, two types of MOSFET structures, one in which the p base region 5 and the n source region 4 have the same taper angle θ and the other in which the p base region 5 has the taper angle θ but not the n source region 4 (θ=0), are considered referring to FIGS. 5 and 6. When the implantation depth of the p base region 5 is given as dp and the implantation depth of the n source region 4 is given as dn, the channel length Lch and the intervals Ld1 and Ld2 of the p base region 5 satisfy the relation as the one shown in FIG. 5 or 6. To elaborate, when the p base region 5 and the n source region 4 have the same taper angle θ, the relation shown in FIG. 5, the channel length Lch=(dp−dn) sin θ, Ld2=Ld1+2dp sin θ, is satisfied and, when the n source region 4 does not have the taper angle θ, the relation shown in FIG. 6, the channel length Lch=dp sin θ, Ld2=Ld1+2dp sin θ, is satisfied.

Here, parameters of the MOSFET, which is assumed to be a device having a withstand voltage of 1200 V for use as an in-vehicle or industrial inverter and which uses as the drift region 6 a 10 μm-thick substrate having a carrier concentration of $1\times10^{16}$ cm$^{-3}$, include setting dp to 0.9 μm and dn to 0.3 μm. The interval Ld2 in relation to the taper angle θ is calculated setting Ld1 to 2.5 μm and, assuming that the interval Ld2 determines the JFET resistance Rj, the JFET resistance Rj is obtained from FIG. 4. The channel resistance Rch is 20 mΩ/cm$^2$ when the channel length Lch is 2 μm according to the results of the experimental manufacture carried out by the inventors of the present invention. The channel resistance Rch is expected to be reduced through device miniaturization (in which a MOSFET is reduced in channel length and increased in channel width) and improvement of the process in the future and, for that reason, the channel resistance Rch of the p base region 5 when the channel length Lch is 2 μm is assumed here to be 20, 10, and 5 mΩ/cm$^2$. The channel resistance Rch is calculated from the channel length Lch in relation to the taper angle θ assuming that the channel resistance Rch is in proportion to the channel length Lch.

Figure 7:
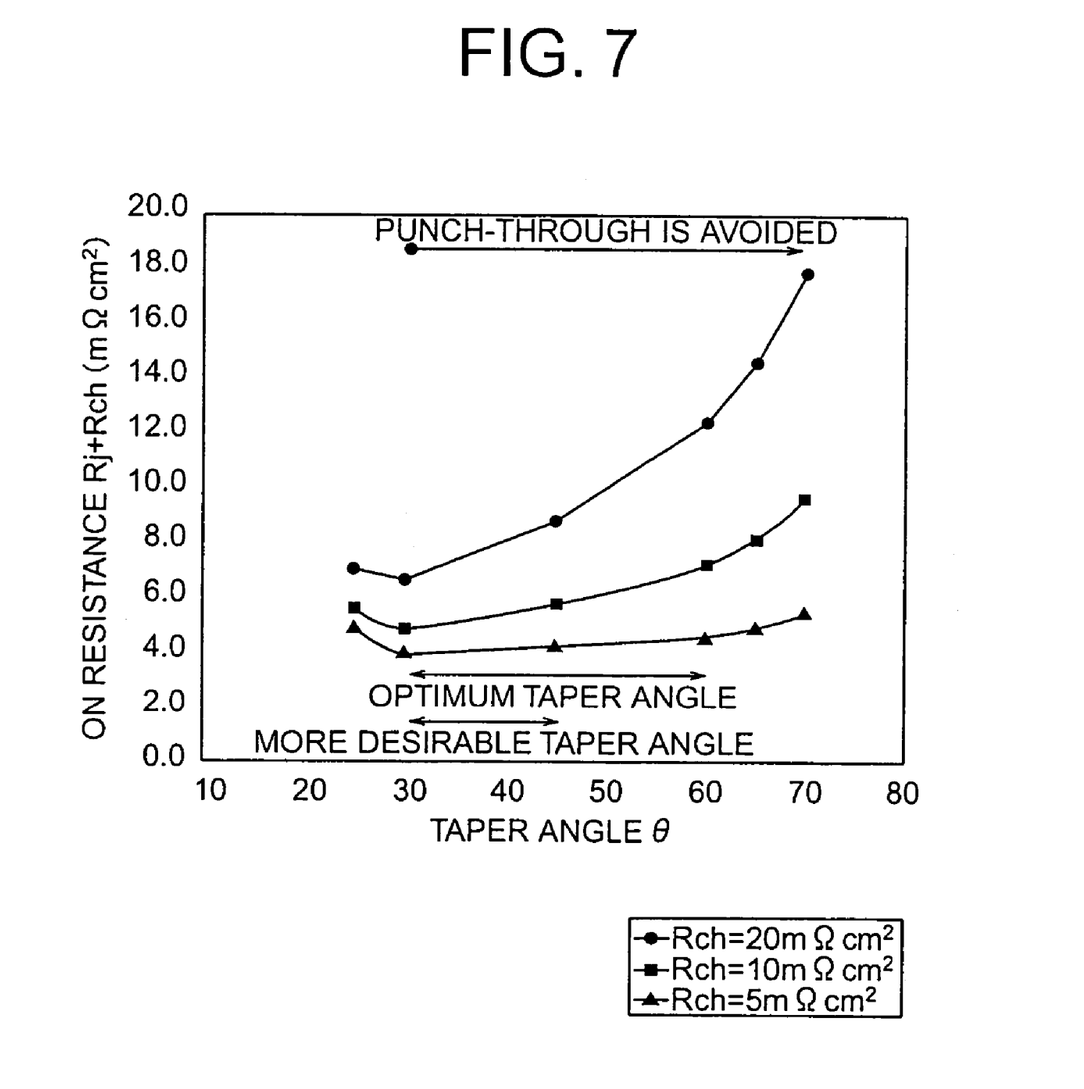
FIG. 7 is a graph showing the relation between the taper angle of the p base region 5 and ON resistance in the case where the n source region 4 is tapered in the semiconductor device that is manufactured in accordance with Embodiment 1 of the present invention.
Figure 8:
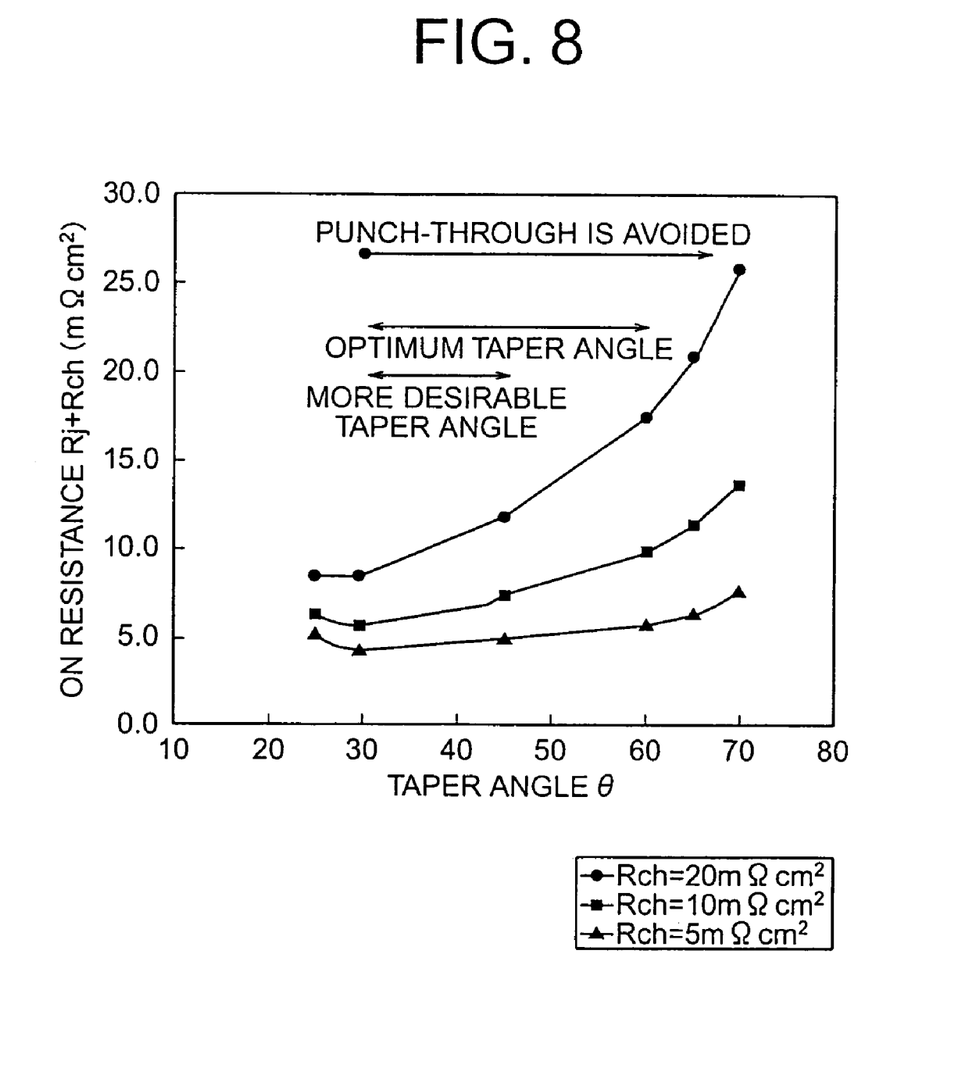
FIG. 8 is a graph showing the relation between the taper angle of the p base region 5 and ON resistance in the case where the n source region 4 is not tapered in the semiconductor device that is manufactured in accordance with Embodiment 1 of the present invention.

FIGS. 7 and 8 show results of calculating, by the above method, the relation between the ON resistance (=Rj+Rch) and the taper angle θ when the n source region 4 has the taper angle θ and when the n source region 4 does not. When the taper angle θ is small (60° or less), the channel length Lch is small and accordingly the channel resistance Rch is small except when the taper angle θ is 30° or less, where the lower interval Ld2 of the p base region 5 is reduced to cause a rapid increase in JFET resistance Rj. Therefore, the taper angle θ is desirably 30° to 60° (30° or more and 60° or less), more desirably, 30° to 45° (30° or more and 45° or less).

Figure 9:
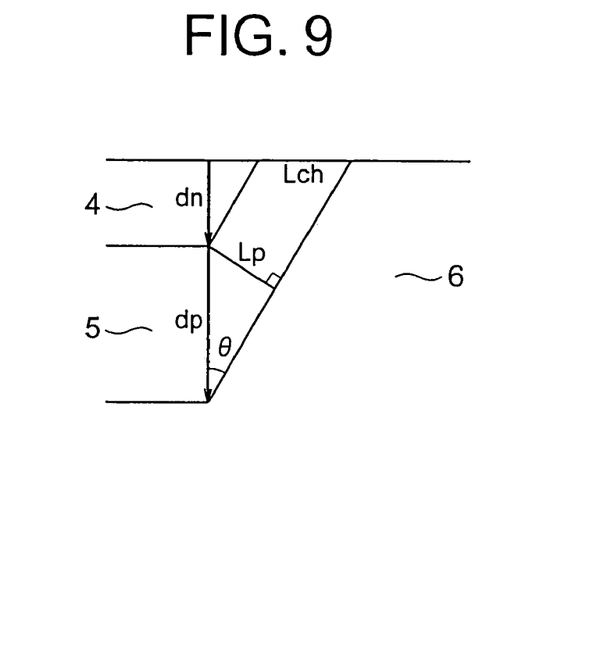
FIG. 9 is a diagram illustrating the taper angle of the p base region 5 and the bounds of punch-through in the semiconductor device that is manufactured in accordance with Embodiment 1 of the present invention.

FIGS. 7 and 8 state that punch-through is avoided when the taper angle θ is 30° or larger. This means that an interval Lp (the minimum value of an interval of the source region 4 and the base region 5) shown in FIG. 9 becomes 0.3 μm or less as the taper angle θ reaches 30° or smaller to cause punch-through and lower the withstand voltage of the MOSFET In the device with a 1200-V withstand voltage which is chosen here as a specific example of the MOSFET, the concentration of the p base region 5 is $5\times10^{17}$ to $10\times10^{18}$ cm$^{-3}$ and the drift region has a concentration of $1\times10^{16}$ cm$^{-3}$. A depletion layer when the drain voltage of the MOSFET is 1200 V extends 0.11 to 0.23 μm on the side of the p base region 5. Punch-through is caused as the interval Lp becomes smaller than the depletion layer. There is a strong possibility of punch-through when the interval Lp is 0.3 μm or less taking into account a margin in a device manufacturing process. Therefore, in order to avoid punch-through, the taper angle θ has to be set to 30° or more, so that the interval Lp becomes equal to or more than 0.3 μm.

FIGS. 7 and 8 show only the results of the case when Ld1 is 2.5 μm, but the ON resistance exhibits an identical taper angle dependency throughout the optimum value range of the interval Ld of the p base region 5 (Ld1=2 to 4 μm). When the upper interval Ld1 of the p base region 5 is 2.5 μm or more, the influence of the JFET resistance Rj is small and the taper angle dependency of the ON resistance is approximately identical with the one in FIGS. 7 and 8. When the upper interval Ld1 of the p base region 5 is 2.5 μm or less, the influence of the JFET resistance Rj is large and the absolute value of the ON resistance is larger than in FIGS. 7 and 8 at any taper angle, but still the taper angle dependency of the ON resistance is the same. Therefore, when the Ld1 is 2 to 4 μm, the taper angle θ of the p base region 5 is desirably 30° to 60°, more desirably, 30° to 45°.

According to Embodiment 1, the base region 5 of the vertical MOSFET that uses SiC is tapered to thereby improve the trade-off relation between the channel resistance and the JFET resistance and advance device miniaturization.

Embodiment 2

Figure 10:
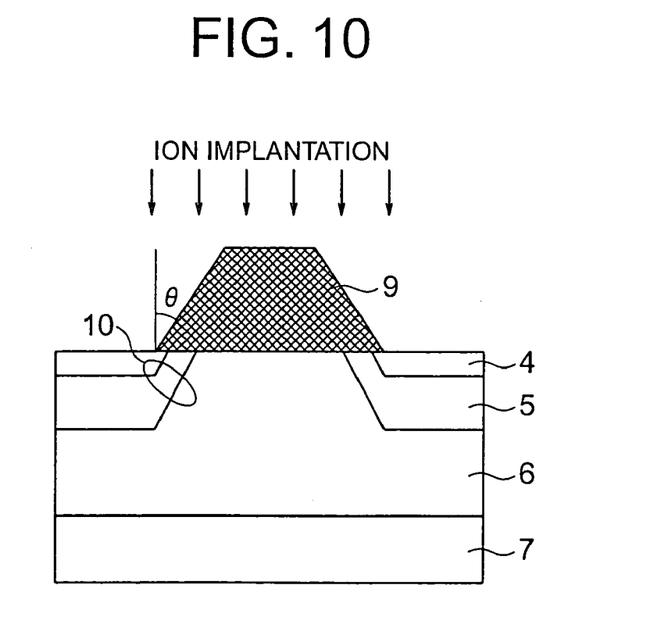
FIG. 10 is a diagram to illustrate a method of manufacturing a semiconductor device in accordance with Embodiment 2 of the present invention by showing a method of forming a source region 4 and a base region 5 by ion implantation.

FIG. 10 is a diagram to illustrate a method of manufacturing a semiconductor device according to Embodiment 2 of the present invention in which the source region 4 and the base region 5 of the semiconductor device (SiC vertical MOSFET) shown in FIG. 1 are formed by ion implantation. If a tapered ion implantation mask 9 as shown in FIG. 10 is used in ion implantation, a taper end portion 10 is implanted with ions even though it is under the implantation mask 9. The width of the region that is implanted with ions despite being under the implantation mask 9 is in proportion to the depth of the ion implantation. Since ions are implanted deeper in the base region 5 than in the source region 4, a region where ions are implanted in the base region 5 alone and not in the source region 4 is created under the mask 9. This region serves as a channel of the MOSFET In addition, the source region 4 and the base region 5 are both tapered, thus obtaining an effect of improving the trade-off relation between the JFET resistance Rj and the channel resistance Rch upon miniaturization as described in Embodiment 1.

Figure 11:
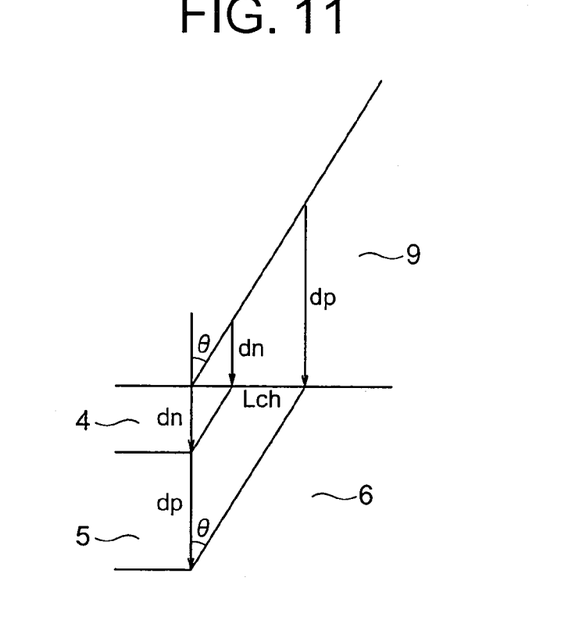
FIG. 11 is a diagram showing the relation among the taper angle of a mask, a channel length Lch, and the taper angle of the p base region 5 in the case where the implantation mask has the same range as SiC in the semiconductor device that is manufactured in accordance with Embodiment 2 of the present invention.
Figure 12:
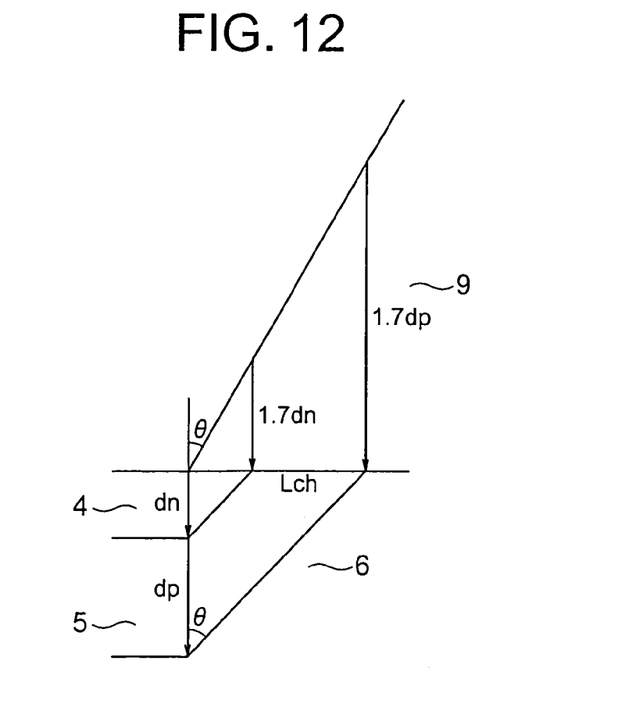
FIG. 12 is a diagram showing the relation among the taper angle of the mask, the channel length Lch, and the taper angle of the p base region 5 in the case where the implantation mask is a $SiO_2$ mask in the semiconductor device that is manufactured in accordance with Embodiment 2 of the present invention.

The channel length and the taper angle of the base region 5 are determined by the material of the implantation mask 9 and the taper angle θ. Specifically, the relation among the shape of the implantation mask, the channel length Lch, and the taper angle of the base region 5 is examined for a case (a) where the implantation mask 9 is formed from a material that has the same ion implantation range as SiC and for a case (b) where the implantation mask 9 is formed from $SiO_2$, which has been used in the experimental manufacture by the inventors of the present invention (the implantation range of $SiO_2$ is 1.7 times longer than that of SiC). Results thereof are shown in FIGS. 11 and 12. In the case (a) where a material that has the same ion implantation range as SiC is employed for the implantation mask 9, the taper angle θ of the implantation mask 9 matches the taper angle θ of the p base region 5 as shown in FIG. 11. In the case (b) where $SiO_2$ is employed for the implantation mask 9, a taper angle θ' of the p base region 5 is larger than a taper angle θ of the implantation mask 9 as shown in FIG. 12. This is because the range of $SiO_2$ is 1.7 times the range of SiC, from which is extracted the relation 1.7 tan θ=tan θ'.

As has been described in the preceding Embodiment 1, the taper angle θ of the p base region 5 is desirably 30° to 60°, more desirably, 30° to 45° in the case where a device for use as an in-vehicle or industrial inverter, which has a withstand voltage of 1200 V, is manufactured. Therefore, when a material that has the same ion implantation range as SiC is employed, the taper angle θ of the implantation mask 9 is desirably 30° to 60°, more desirably, 30° to 45° and, when the implantation mask 9 is formed from $SiO_2$, the taper angle θ of the implantation mask 9 is desirably 20° to 45°, more desirably, 20° to 30° from the relation 1.7 tan θ=tan θ'.

A method to process the implantation mask 9 into a desired shape when the implantation mask 9 is formed from $SiO_2$ is dry etching using a resist mask. If the etching selective ratio of $SiO_2$ to the resist is large, $SiO_2$ alone is dry-etched to give vertical side faces to the $SiO_2$ implantation mask. On the other hand, if the etching selective ratio is small, the resist is dry-etched as well as the $SiO_2$ mask to thereby reduce the width of the resist that is used as an etching mask. Through etching under such conditions, the implantation mask made of $SiO_2$ is tapered and its taper angle can be controlled by the selective ratio of $SiO_2$ to the resist.

According to Embodiment 2, a selective impurity doping can be carried out by the above-described method through a self-alignment process that uses the same mask 9. In addition, the channel length of the MOSFET and the taper angle of the p base region 5 can readily be controlled by controlling the shape of the implantation mask 9, and it is advantageous in miniaturization of the MOSFET Furthermore, the trade-off relation between the channel resistance Rch and the JFET resistance Rj can be improved by providing the p base region 5 with a taper angle.

Embodiment 3

Figure 13:
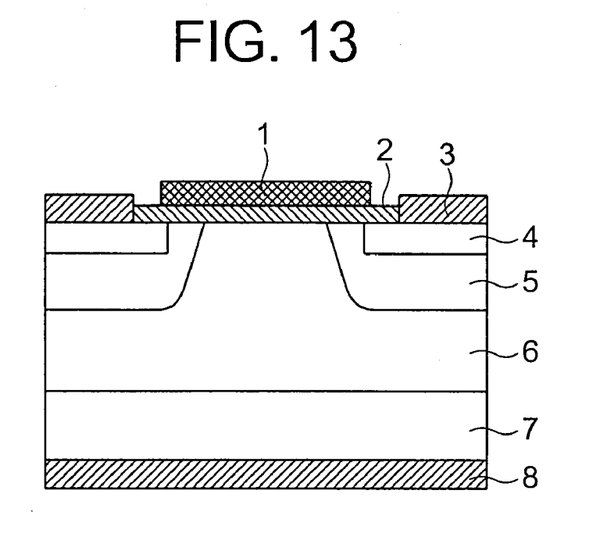
FIG. 13 is a sectional view showing a semiconductor device (SiC vertical MOSFET) manufactured in accordance with Embodiments 3 and 5 of the present invention.

FIG. 13 is a sectional view showing a semiconductor device (SiC vertical MOSFET) manufactured in accordance with Embodiment 3 of the present invention. A source region 4 and a base region 5 are formed by ion implantation in a drift region 6, which is formed through epitaxial growth on a substrate 7. Then a gate oxide film 2, a gate electrode 1, a source electrode 3, and a drain electrode 8 are formed to complete the MOSFET.

Figure 14:
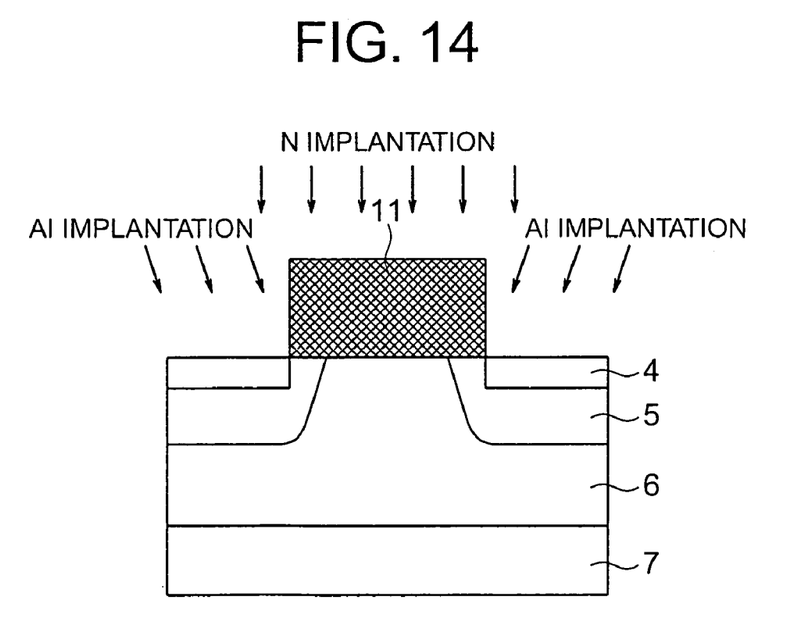
FIG. 14 is a diagram to illustrate a method of manufacturing a semiconductor device in accordance with Embodiment 3 of the present invention by showing a method of forming a source region 4 and a base region 5 by ion implantation.

FIG. 14 is a diagram to illustrate a method of manufacturing a semiconductor device in accordance with Embodiment 3 of the present invention by showing a method of forming the source region 4 and the base region 5 by ion implantation. As shown in FIG. 14, N ions, for example, are implanted vertically with respect to the substrate and at the same time Al ions are implanted obliquely with respect to the substrate at an implantation angle that is smaller than that of N ions. When an implantation mask 11 that has vertical side faces as in prior art is used, a region under the implantation mask 11 is not implanted with N ions and is implanted with Al ions alone. This region serves as a channel of the MOSFET. In addition, if the material of the implantation mask 11 is $SiO_2$ or the like that has a longer ion implantation range than SiC, the base region 5 is tapered to thereby obtain an effect of improving the trade-off relation between the JFET resistance Rj and the channel resistance Rch upon miniaturization as described in Embodiment 1.

Figure 15:
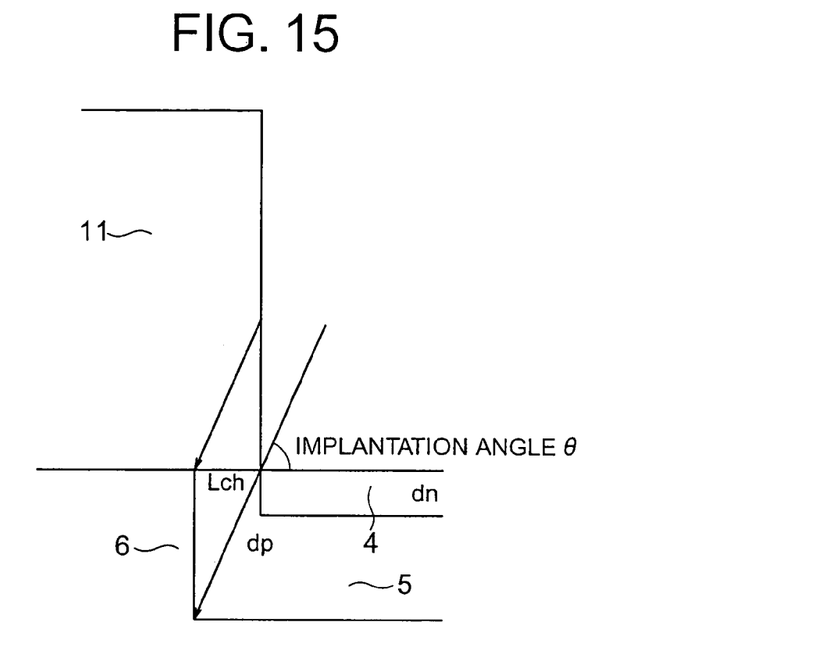
FIG. 15 is a diagram showing the relation among the ion implantation angle, a channel length Lch, and the taper angle of the p base region 5 in the case where an implantation mask has the same range as SiC in the semiconductor device that is manufactured in accordance with Embodiment 3 of the present invention.
Figure 16:
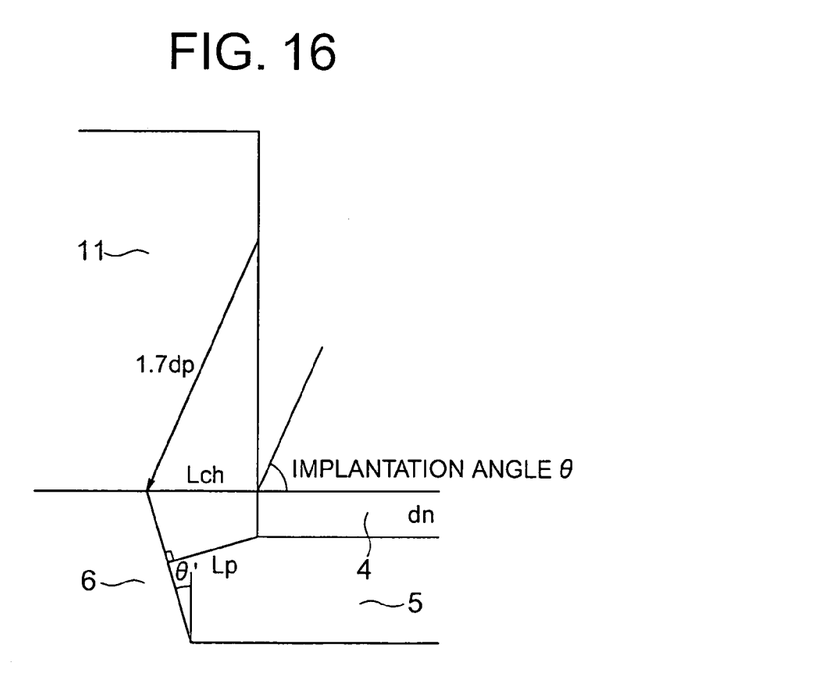
FIG. 16 is a diagram showing the relation among the ion implantation angle, the channel length Lch, and the taper angle of the p base region 5 in the case where the implantation mask is a $SiO_2$ mask in the semiconductor device that is manufactured in accordance with Embodiment 3 of the present invention.

The channel length and the taper angle of the base region 5 are determined by the material of the implantation mask 11 and the ion implantation angle. Specifically, the relation among the ion implantation angle, the channel length Lch, and the taper angle of the base region 5 is examined for a case (a) where the implantation mask 11 is formed from a material that has the same ion implantation range as SiC and for a case (b) where the implantation mask 11 is formed from $SiO_2$, which has been used in the experimental manufacture by the inventors of the present invention (the implantation range of $SiO_2$ is 1.7 times longer than that of SiC). Results thereof are shown in FIGS. 15 and 16. In the case (a) where a material that has the same ion implantation range as SiC is employed for the implantation mask 11, the taper angle of the p base region 5 is vertical, matching the shape of the mask as shown in FIG. 15. In the case (b) where $SiO_2$ is employed for the implantation mask 11, the p base region 5 is tapered and its taper angle θ" is larger than 0° as shown in FIG. 16.

Here, parameters of the MOSFET which is assumed to be a device having a withstand voltage of 1200 V for use as an in-vehicle or industrial inverter and which uses as the drift region 6 a 10 μm-thick substrate having a carrier concentration of $1\times10^{16}$ cm$^{-3}$, include setting dp to 0.9 μm and dn to 0.3 μm as in Embodiment 1, and the optimum implantation angle under this setting is examined.

Figure 17:
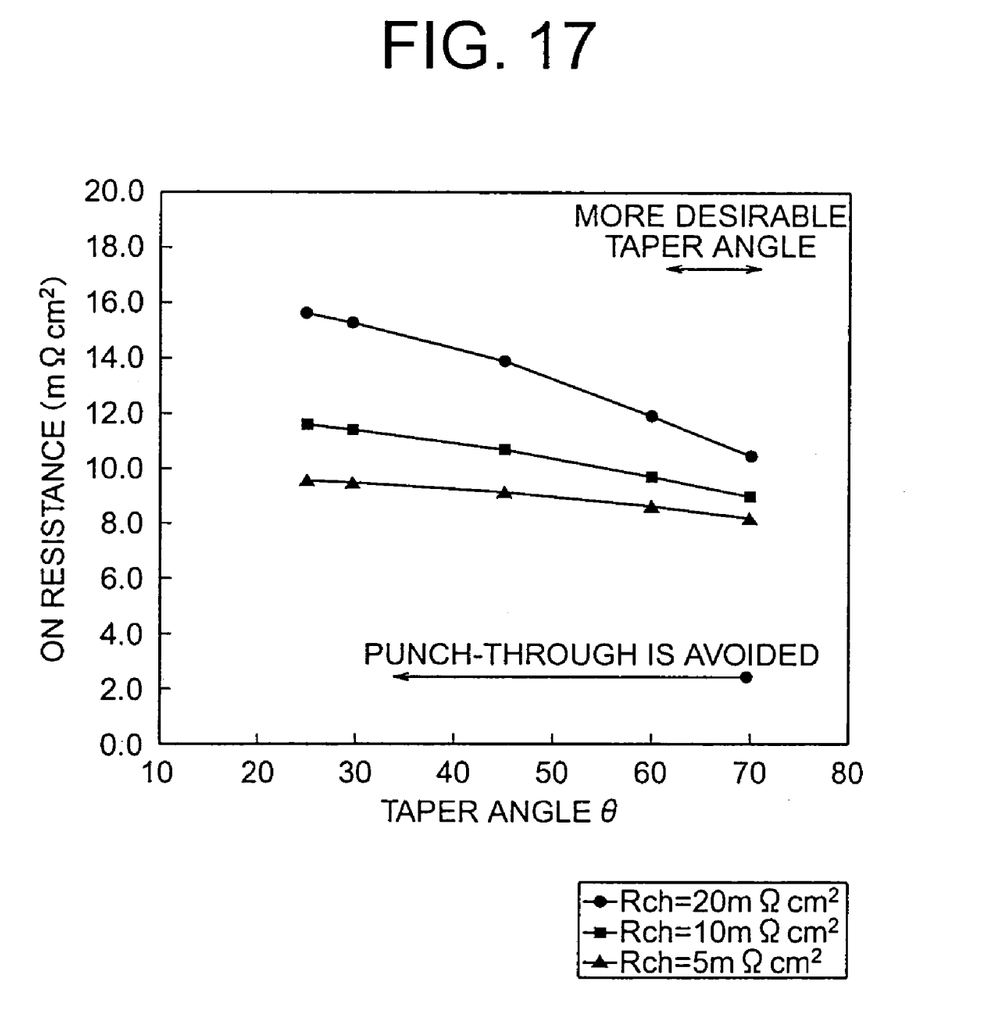
FIG. 17 is a graph showing the relation between the ion implantation angle and ON resistance in the case where the implantation mask has the same range as SiC in the semiconductor device that is manufactured in accordance with Embodiment 3 of the present invention.

First, the case (a) where the implantation mask 11 is formed from a material that has the same ion implantation range as SiC is considered. The angle of the p base region 5 is not changed by the implantation angle θ and therefore the JFET resistance Rj is not changed. The channel length Lch is calculated in relation to the ion implantation angle θ to obtain the channel resistance Rch. As described in Embodiment 1, the ON resistance (Rj+Rch) obtained in relation to the ion implantation angle θ when the interval Ld1 of the p base region 5 is 2.5 vm is as shown in FIG. 17. Shown here is the case in which Ld1 is 2.5 μm but the ON resistance decreases steadily as the implantation angle θ is increased irrespective of how large the interval Ld1 of the p base region 5 is. In other words, the ON resistance is small when the implantation angle θ is large and the channel length Lch is small. However, as the channel length Lch becomes smaller, punch-through takes place to lower the withstand voltage as described in Embodiment 1. To elaborate, the channel length Lch can be expressed as Lch=dp·cos θ in FIG. 15 and punch-through is caused when Lp=Lch=0.3 μm or less. Taking this into account, the ion implantation angle θ has to be set to 70° or less in order to set the interval Lp to 0.3 μm or more.

To summarize the above, in the case (a) where the implantation mask 11 is formed from a material that has the same ion implantation range as SiC, the optimum ion implantation angle θ is 70° or less and, taking into account the margin, the implantation angle is desirably large around 60° to 70°.

Figure 18:
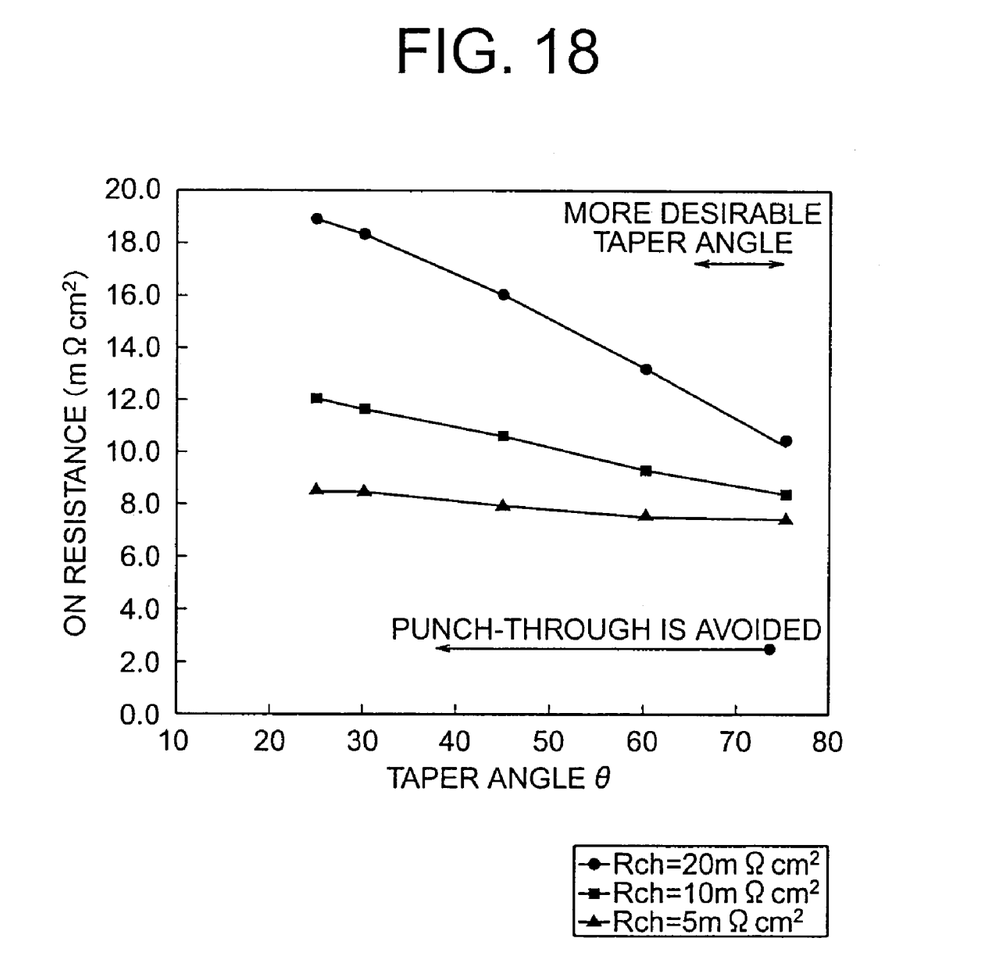
FIG. 18 is a graph showing the relation between the ion implantation angle and ON resistance in the case where the implantation mask is a $SiO_2$ mask in the semiconductor device that is manufactured in accordance with Embodiment 3 of the present invention.

Next, the case (b) where the implantation mask 11 is formed from $SiO_2$ (which has an implantation range 1.7 times longer than that of SiC) is considered. The taper angle θ' of the p base region 5 and the channel length Lch can be calculated in relation to the ion implantation angle θ. As described in Embodiment 1, the interval Ld2 in relation to the taper angle θ' is calculated setting Ld1 to 2.5 μm and, assuming that the interval Ld2 determines the JFET resistance Rj, the JFET resistance Rj is obtained from FIG. 4. The channel resistance Rch is similarly calculated from the channel length Lch. Then, the ON resistance (=JFET resistance Rj+channel resistance Rch) obtained in relation to the ion implantation angle θ is as shown in FIG. 18.

Shown here is the case in which Ld1 is 2.5 μm but the tendency of steady decrease of the ON resistance to an increase of the implantation angle θ is maintained as far as Ld1 is 2 to 4 μm. In other words, a large implantation angle θ and a short channel length Lch mean low ON resistance and a small influence on a change of the JFET resistance Rj. As to punch-through, the implantation angle θ has to be 75° or less in order to set Lp to 0.3 μm or more. To elaborate, Lch, θ, and Lp can be expressed as Lch=1.7·dp·cos θ, tan θ=0.7 cot θ', Lp=Lch·cos θ'−dn·sin θ', respectively, in FIG. 16 and punch-through is caused when Lp=0.3 μm or less. Taking this into account, the ion implantation angle θ has to be set to 75° or less in order to set the interval Lp to 0.3 μm or more.

To summarize the above, in the case (b) where the implantation mask 11 is formed from $SiO_2$ (which has an implantation range 1.7 times longer than that of SiC), the optimum ion implantation angle θ is 75° or less and, taking into account the margin, the implantation angle is desirably large around 65° to 75°.

In actual ion implantation, the ion implantation angle can be controlled by simply tilting a substrate to match the direction of an implantation mask utilizing orientation flat of the substrate. Although Al is implanted at two different angles on the left and on the right in FIG. 14, it is also possible to implant ions at two or more different angles on each side. The implantation illustrated in FIG. 14 can be achieved by a single implantation operation if the substrate is tilted and rotated upon ion implantation instead of merely tilting the substrate to the left and right.

According to Embodiment 3, a selective impurity doping can be carried out by the above-described method through a self-alignment process that uses the same mask. In particular, the channel length of the MOSFET can readily be controlled by controlling the depth and angle of ion implantation, and it is advantageous in MOSFET miniaturization over prior art in which different masks have to be used for ion implantation. Furthermore, the p base region 5 can be tapered by using for an ion implantation mask a material that has a longer ion implantation range than SiC, and the trade-off relation between the channel resistance Rch and the JFET resistance Rj is thus improved upon device miniaturization.

Embodiment 4

Figure 19:
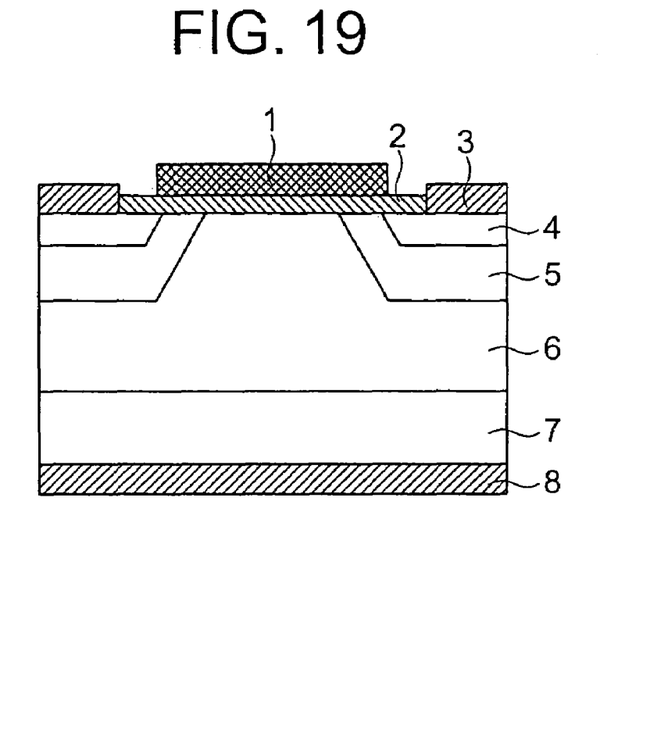
FIG. 19 is a sectional view showing a semiconductor device (SiC vertical MOSFET) manufactured in accordance with Embodiments 4 and 6 of the present invention.

FIG. 19 is a sectional view showing a semiconductor device (SiC vertical MOSFET) manufactured in accordance with Embodiment 4 of the present invention. A source region 4 and a base region 5 are formed by ion implantation in a drift region 6, which is formed through epitaxial growth on a substrate 7. Then a gate oxide film 2, a gate electrode 1, a source electrode 3, and a drain electrode 8 are formed to complete the MOSFET.

Figure 20:
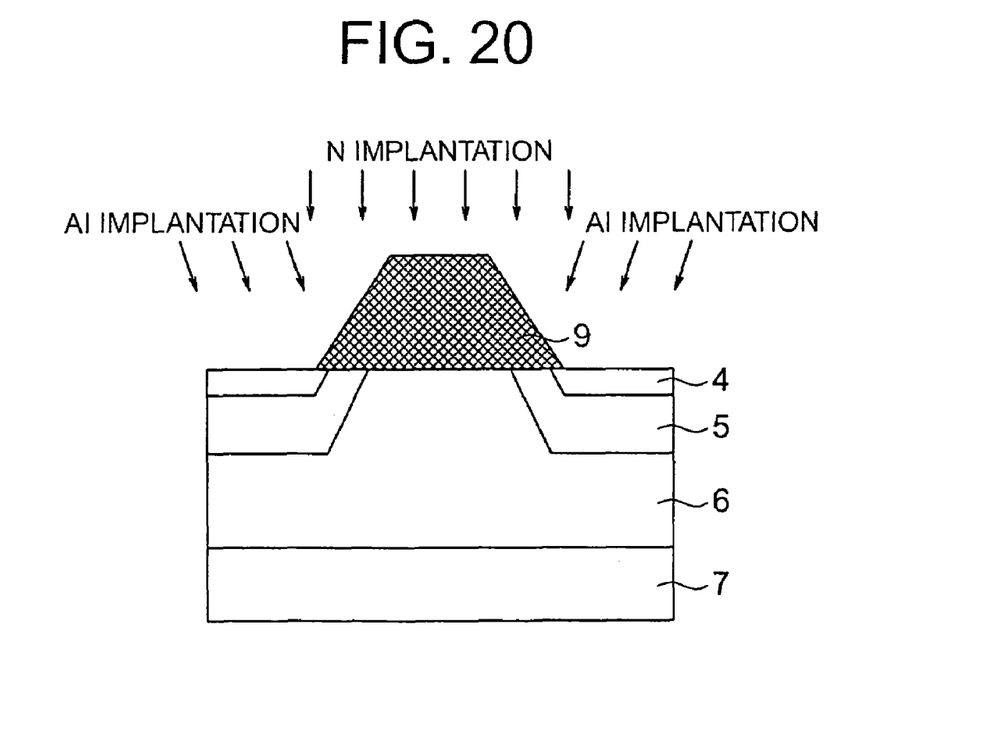
FIG. 20 is a diagram to illustrate a method of manufacturing a semiconductor device in accordance with Embodiment 4 of the present invention by showing a method of forming a source region 4 and a base region 5 by ion implantation.

FIG. 20 is a diagram to illustrate a method of manufacturing a semiconductor device in accordance with Embodiment 4 of the present invention by showing a method of forming the source region 4 and the base region 5 by ion implantation. As shown in FIG. 20, similar to the above Embodiments 2 and 3, a region where the base region 5 alone is implanted with ions is created under a tapered implantation mask 9 by implanting ions vertically and obliquely with respect to the substrate using the implantation mask 9. This region serves as a channel of the MOSFET. The channel length and the taper angle of the p base region 5 can be controlled by controlling the depth and implantation angle of ion implantation and the shape (taper angle) of the implantation mask.

According to Embodiment 4, a selective impurity doping can be carried out by the above-described method through a self-alignment process that uses the same mask. In particular, Embodiment 4 has more parameters that control the channel length and the taper angle of the p base region 5 than Embodiments 2 and 3, making it possible to facilitate MOSFET miniaturization and improve the trade-off relation between the channel resistance Rch and the JFET resistance Rj.

Embodiment 5

Figure 21:
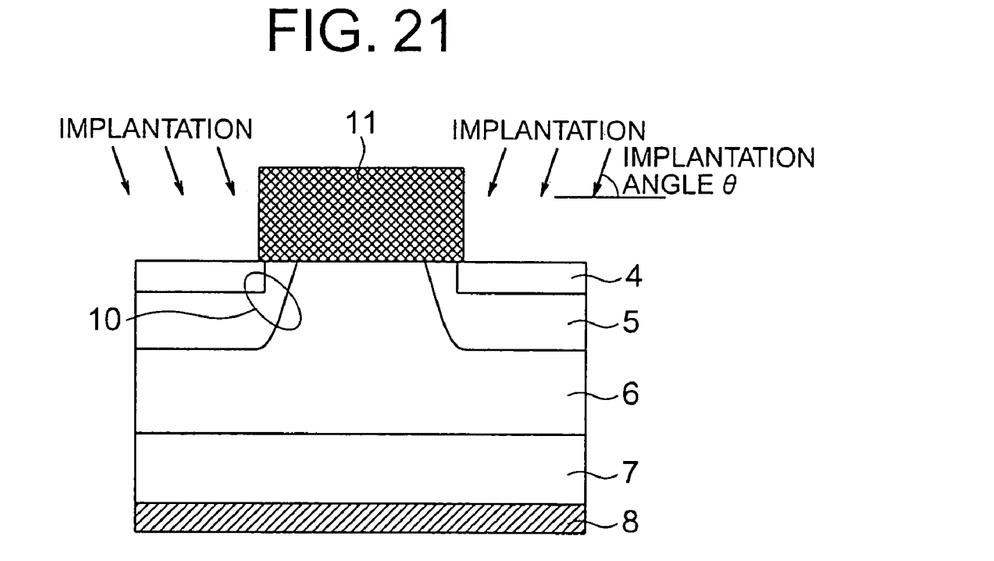
FIG. 21 is a diagram to illustrate a method of manufacturing a semiconductor device in accordance with Embodiment 5 of the present invention by showing a method of forming a source region 4 and a base region 5 by ion implantation.

FIG. 21 is a diagram to illustrate a method of manufacturing a semiconductor device according to Embodiment 5 of the present invention in which the source region 4 and the base region 5 of the semiconductor device (SiC vertical MOSFET) shown in FIG. 13 are formed by ion implantation. As shown in FIG. 21, the source region 4 and the base region 5 are each formed by implanting ions obliquely with respect to the substrate. The width of an implanted region under a mask 10 is increased as the implantation angle θ is reduced. Therefore, if the ion implantation angle θ of the base region 5 is set smaller than that of the source region 4, a region where the base region 5 alone is implanted with ions is created under the mask 10. This region serves as a channel of the MOSFET Similar to Embodiment 3, the channel length can be controlled by controlling the depth and implantation angle of ion implantation.

According to Embodiment 5, a selective impurity doping can be carried out by the above-described method through a self-alignment process that uses the same mask. In particular, the channel length of the MOSFET can readily be controlled by controlling the depth and angle of ion implantation, and it is advantageous in MOSFET miniaturization over prior art in which different masks have to be used for ion implantation. Furthermore, the p base region 5 can be tapered by using for an ion implantation mask a material that has a longer ion implantation range than SiC, and the trade-off relation between the channel resistance Rch and the JFET resistance Rj is thus improved upon MOSFET miniaturization.

Embodiment 6

Figure 22:
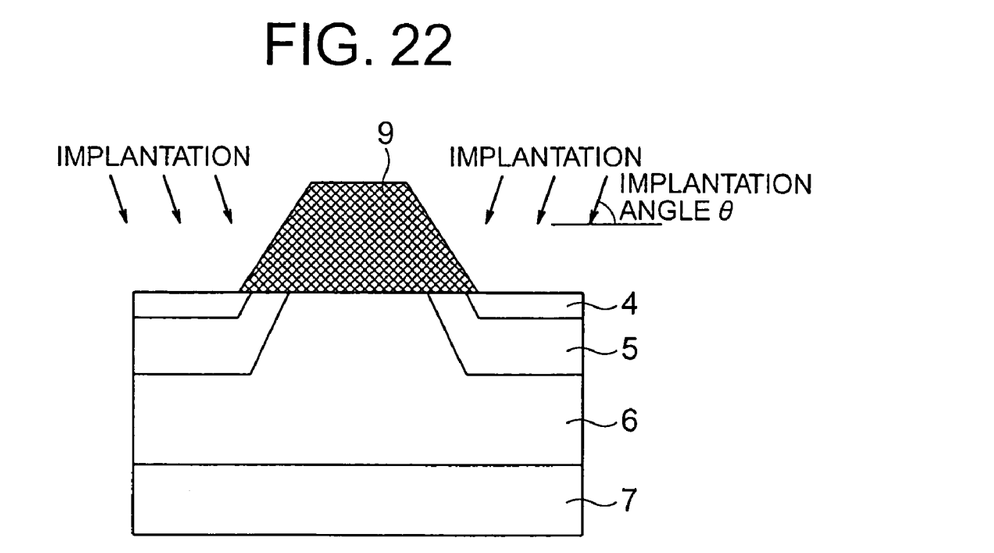
FIG. 22 is a diagram to illustrate a method of manufacturing a semiconductor device in accordance with Embodiment 6 of the present invention by showing a method of forming a source region 4 and a base region 5 by ion implantation.

FIG. 22 is a diagram to illustrate a method of manufacturing a semiconductor device according to Embodiment 6 of the present invention in which the source region 4 and the base region 5 of the semiconductor device (SiC vertical MOSFET) shown in FIG. 19 are formed by ion implantation. As shown in FIG. 22, the source region 4 and the base region 5 are each formed by implanting ions obliquely with respect to the substrate using the tapered implantation mask 9. The width of an implanted region under the mask 9 is increased as the implantation angle θ is reduced. Therefore, if the ion implantation angle θ of the p base region 5 is set smaller than that of the source region 4, a region where the base region 5 alone is implanted with ions is created under the mask 9. This region serves as a channel of the MOSFET Combined with the effect of an implantation mask being tapered, the channel length and the taper angle of the p base region 5 can be controlled by controlling the depth and implantation angle of ion implantation and the shape (taper angle) of the implantation mask.

According to Embodiment 6, a selective impurity doping can be carried out by the above-described method through a self-alignment process that uses the same mask. In particular, Embodiment 6 has more parameters that control the channel length and the taper angle of the p base region 5 than Embodiments 2 and 3, making it possible to facilitate MOSFET miniaturization. Moreover, the trade-off relation between the channel resistance Rch and the JFET resistance Rj can be improved by providing the p base region 5 with a taper angle.

What is claimed is:

1. A method of manufacturing a silicon carbide (SiC) vertical MOSFET, the method comprising:

forming an SiC mask on a surface of a layer of SiC, the SiC mask having side surfaces substantially parallel to a normal to the surface of the layer of SiC;

implanting first ions into the layer of SiC through the surface in a direction forming an angle not larger than 70° with the surface, using the SiC mask as an ion implantation mask, to produce a base region having a first conductivity type in the layer of SiC; and implanting second ions into the layer of SiC through the surface in a direction substantially parallel to the normal, using the SiC mask as an ion implantation mask to produce a source region having a second conductivity type, opposite the first conductivity type, within the base region, so that channel length of the base region, measured along the surface, is at least 0.3 microns.

2. The method according to claim 1 including simultaneously implanting the first ions and the second ions.

3. A method of manufacturing a silicon carbide (SiC) vertical MOSFET, the method comprising:

forming an $SiO_2$ mask on a surface of a layer of SiC, the $SiO_2$ mask having side surfaces forming substantially parallel to a normal to the surface of the layer of SiC;

implanting first ions into the layer of SiC through the surface in a direction forming an angle not larger than 75° with the surface, using the $SiO_2$ mask as an ion implantation mask, to produce a base region having a first conductivity type in the layer of SiC; and implanting second ions into the layer of SiC through the surface in a direction substantially parallel to the normal, using the $SiO_2$ mask as an ion implantation mask to produce a source region having a second conductivity type, opposite the first conductivity type, within the base region, so that the base region has a thickness, relative to the source region, of at least 0.3 microns.

4. The method according to claim 3 including simultaneously implanting the first ions and the second ions.

* * * * *